(12) United States Patent
Miyata

(10) Patent No.: US 9,171,951 B2
(45) Date of Patent: Oct. 27, 2015

(54) MULTIGATE DUAL WORK FUNCTION DEVICE AND METHOD FOR MANUFACTURING SAME

(71) Applicant: KABUSHIKI KAISHA TOSHIBA, Minato-ku, Tokyo (JP)

(72) Inventor: Toshitaka Miyata, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/333,108

(22) Filed: Jul. 16, 2014

(65) Prior Publication Data
US 2015/0263167 A1    Sep. 17, 2015

(30) Foreign Application Priority Data

Mar. 11, 2014    (JP) ................................. 2014-047168

(51) Int. Cl.
| | | |
|---|---|---|
| *H01L 29/423* | (2006.01) | |
| *H01L 29/43* | (2006.01) | |
| *H01L 29/78* | (2006.01) | |
| *H01L 21/8232* | (2006.01) | |
| *H01L 21/28* | (2006.01) | |
| *H01L 29/66* | (2006.01) | |
| *H01L 29/51* | (2006.01) | |
| *H01L 21/311* | (2006.01) | |
| *H01L 29/49* | (2006.01) | |

(52) U.S. Cl.
CPC ...... *H01L 29/7831* (2013.01); *H01L 21/28035* (2013.01); *H01L 21/28158* (2013.01); *H01L 21/31111* (2013.01); *H01L 29/42364* (2013.01); *H01L 29/4916* (2013.01); *H01L 29/517* (2013.01); *H01L 29/66484* (2013.01)

(58) Field of Classification Search
None
See application file for complete search history.

(56) References Cited

U.S. PATENT DOCUMENTS

| | | | |
|---|---|---|---|
| 6,187,657 B1 * | 2/2001 | Xiang et al. .................. | 438/596 |
| 6,225,669 B1 | 5/2001 | Long et al. | |
| 7,262,447 B2 | 8/2007 | Negoro et al. | |
| 7,999,332 B2 | 8/2011 | Yuan et al. | |

(Continued)

FOREIGN PATENT DOCUMENTS

| | | |
|---|---|---|
| EP | 0856892 A2 | 8/1998 |
| JP | 05315605 A | 11/1993 |

OTHER PUBLICATIONS

T. Miyata et al, "Scaling Strategy for Low Power RF Applications with Multi Gate Oxide Dual Work function (DWF) MOSFETs Utilizing Self-Aligned Integration Scheme", VLSI (2013), 2 pages (in English).

*Primary Examiner* — Joseph Schoenholtz
(74) *Attorney, Agent, or Firm* — Holtz, Holtz, Goodman & Chick PC

(57) ABSTRACT

According to one embodiment, a semiconductor device includes a drain region, a source region, a channel region, a first gate insulator film provided on the channel region, a second gate insulator film provided on the channel region to be adjacent to the first gate insulator film on the source region side of the first gate insulator film, a first gate electrode provided on the first gate insulator film, and a second gate electrode provided on the second gate insulator film. An electrical thickness of the second gate insulator film is less than an electrical thickness of the first gate insulator film. A portion of the first gate electrode is provided on the second gate insulator film. A work function of the second gate electrode is higher than a work function of the first gate electrode.

20 Claims, 11 Drawing Sheets

(56) References Cited

U.S. PATENT DOCUMENTS

| | | |
|---|---|---|
| 8,237,233 B2 | 8/2012 | Anderson et al. |
| 8,624,315 B2 | 1/2014 | Zhu et al. |
| 8,853,068 B2* | 10/2014 | Hsu et al. ............ 438/592 |
| 2001/0017390 A1 | 8/2001 | Long et al. |
| 2006/0017113 A1* | 1/2006 | Xu et al. ............ 257/369 |
| 2009/0134466 A1* | 5/2009 | Cho et al. ............ 257/368 |
| 2010/0048013 A1* | 2/2010 | Thei et al. ............ 438/591 |
| 2010/0052067 A1* | 3/2010 | Hsu et al. ............ 257/369 |
| 2010/0059817 A1* | 3/2010 | Pham et al. ............ 257/336 |
| 2010/0283107 A1* | 11/2010 | Muller et al. ............ 257/368 |
| 2013/0015500 A1 | 1/2013 | Izumida et al. |
| 2013/0049122 A1* | 2/2013 | Miyata et al. ............ 257/366 |
| 2014/0175553 A1* | 6/2014 | Miyata et al. ............ 257/365 |

* cited by examiner

MULTIGATE DUAL WORK FUNCTION DEVICE AND METHOD FOR MANUFACTURING SAME

CROSS-REFERENCE TO RELATED APPLICATION

This application is based upon and claims the benefit of priority from Japanese Patent Application No. 2014-047168, filed on Mar. 11, 2014; the entire contents of which are incorporated herein by reference.

FIELD

Embodiment described herein relate generally to a semiconductor device and a method for manufacturing a semiconductor device.

BACKGROUND

A channel length modulation problem occurs when downscaling a CMOS analog device. To solve this problem, a multi gate oxide dual work function (DWF)-MOSFET has been proposed in which two gate electrode materials having different work functions are disposed in the channel-length direction.

DETAILED DESCRIPTION

Figure 1:
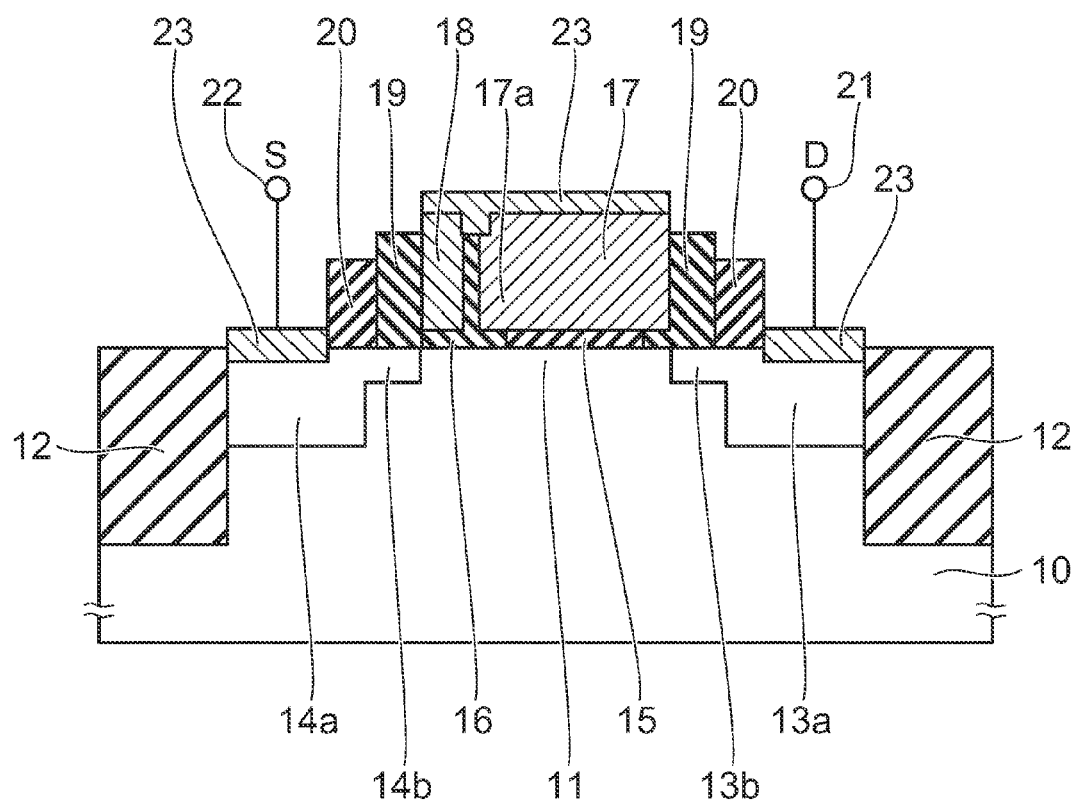
FIG. 1 is a schematic cross-sectional view of a semiconductor device of an embodiment.

According to one embodiment, a semiconductor device includes a drain region of a first conductivity type, a source region of the first conductivity type, a channel region of a second conductivity type provided between the drain region and the source region, a first gate insulator film provided on the channel region, a second gate insulator film provided on the channel region to be adjacent to the first gate insulator film on the source region side of the first gate insulator film, a first gate electrode provided on the first gate insulator film, and a second gate electrode provided on the second gate insulator film. An electrical thickness of the second gate insulator film is less than an electrical thickness of the first gate insulator film. A portion of the first gate electrode is provided on the second gate insulator film. A work function of the second gate electrode is higher than a work function of the first gate electrode.

Embodiments will now be described with reference to the drawings. Similar components in the drawings are marked with like reference numerals. Although the first conductivity type is taken to be an n-type and the second conductivity type is taken to be a p-type in the description of the embodiments recited below, the embodiments are practicable also in the case where the first conductivity type is the p-type and the second conductivity type is the n-type.

FIG. 1 is a schematic cross-sectional view of a semiconductor device of an embodiment. The semiconductor device of the embodiment has, for example, an n-channel MOSFET (Metal-Oxide-Semiconductor Field Effect Transistor) structure.

An element region is formed on the surface side of a semiconductor layer 10; and the element region is separated from the other element regions by an element separation region 12.

The semiconductor layer 10 is, for example, a silicon substrate. Or, the semiconductor layer 10 is a silicon layer having an SOI (Silicon On Insulator) structure. Or, the semiconductor layer 10 may be a layer (a substrate) other than silicon such as, for example, SiC, GaN, etc.

The element separation region 12 has, for example, a STI (Shallow Trench Isolation) structure and has a structure in which an insulating film (e.g., a silicon oxide film) is filled into a trench.

A drain region 13a, a drain extension region 13b, a source region 14a, and a source extension region 14b that are all the n-type are formed in the surface of the element region of the semiconductor layer 10.

The drain extension region 13b is adjacent to the end of the drain region 13a on the source region 14a side; and the source extension region 14b is adjacent to the end of the source region 14a on the drain region 13a side.

The drain region 13a is deeper and has a higher n-type impurity concentration than the drain extension region 13b. The source region 14a is deeper and has a higher n-type impurity concentration than the source extension region 14b.

A p-type channel region 11 is formed in the surface of the semiconductor layer 10 between the drain extension region 13b and the source extension region 14b.

A first gate insulator film 15 and a second gate insulator film 16 are provided on the channel region 11. The first gate insulator film 15 is formed on the drain side (the drain region 13a and drain extension region 13b side); and the second gate insulator film 16 is formed to be adjacent to the first gate insulator film 15.

The second gate insulator film 16 is formed on the source side (the source region 14a and source extension region 14b side) of the first gate insulator film 15.

The electrical thickness (equivalent oxide thickness) of the second gate insulator film 16 is less than the electrical thickness (equivalent oxide thickness) of the first gate insulator film 15. The physical film thickness of the first gate insulator film 15 and the physical film thickness of the second gate insulator film 16 are substantially equal. Accordingly, according to the embodiment, the equivalent oxide thickness of the second gate insulator film 16 is set to be less than the equivalent oxide thickness of the first gate insulator film 15 by setting the dielectric constant of the second gate insulator film 16 to be higher than the dielectric constant of the first gate insulator film 15.

For example, the first gate insulator film 15 is a silicon oxide film (a $SiO_2$ film); and the second gate insulator film 16 is an oxide film including hafnium. For example, the second gate insulator film 16 includes one selected from HfO, HfSiO, and HfSiON. For example, the second gate insulator film 16 is a $HfO_2$ film.

In the case where the first gate insulator film 15 and the second gate insulator film 16 are made of the same material (having the same dielectric constant), the equivalent oxide thickness of the second gate insulator film 16 may be set to be less than the equivalent oxide thickness of the first gate insulator film 15 by setting the physical film thickness of the second gate insulator film 16 to be thinner than the physical film thickness of the first gate insulator film 15.

Also, it is possible to set the dielectric constant of the second gate insulator film 16 to be higher than the dielectric constant of the first gate insulator film 15 and set the physical film thickness of the second gate insulator film 16 to be thinner than the physical film thickness of the first gate insulator film 15.

A first gate electrode 17 is provided on the first gate insulator film 15. Also, a portion (an end portion 17a on the source side) of the first gate electrode 17 extends to the second gate insulator film 16 side of the boundary between the first gate insulator film 15 and the second gate insulator film 16. In other words, the end portion 17a of the first gate electrode 17 on the source side is provided also on the second gate insulator film 16.

A second gate electrode 18 is provided on the second gate insulator film 16. The second gate insulator film 16 is provided between one side wall of the first gate electrode 17 on the second gate electrode 18 side and one side wall of the second gate electrode 18 on the first gate electrode 17 side.

The second gate insulator film 16 is provided in an inverted T-shaped cross-sectional configuration under the first gate electrode 17, under the second gate electrode 18, and between the side wall of the first gate electrode 17 and the side wall of the second gate electrode 18.

The first gate electrode 17 and the second gate electrode 18 extend in the gate width direction (the direction piercing the page surface in FIG. 1) orthogonal to the gate-length direction. The gate length of the first gate electrode 17 is longer than the gate length of the second gate electrode 18.

The work function of the second gate electrode 18 is higher than the work function of the first gate electrode 17. For example, the first gate electrode 17 is an n-type polycrystalline silicon layer; and the second gate electrode 18 is a p-type polycrystalline silicon layer. Because the second gate insulator film 16 is interposed between the first gate electrode 17 and the second gate electrode 18, the diffusion of the impurities of each conductivity type between the n-type silicon gate and the p-type silicon gate is suppressed; and the work functions that are set for the n-type silicon gate and the p-type silicon gate can be maintained easily.

A first sidewall insulating film 19 is provided on the other side wall of the first gate electrode 17 in the gate-length direction. A second sidewall insulating film 20 is provided on the side wall of the first sidewall insulating film 19. The first sidewall insulating film 19 and the second sidewall insulating film 20 are provided on the drain extension region 13b. The first sidewall insulating film 19 and the second sidewall insulating film 20 are, for example, silicon oxide films.

The first sidewall insulating film 19 is provided also on the other side wall of the second gate electrode 18 in the gate-length direction; and the second sidewall insulating film 20 is provided on the side wall of the first sidewall insulating film 19. The first sidewall insulating film 19 and the second sidewall insulating film 20 that are on the source side are provided on the source extension region 14b.

A metal silicide film 23 is provided on the drain region 13a and on the source region 14a. The drain region 13a is electrically connected to a drain electrode 21 via the metal silicide film 23. The source region 14a is electrically connected to a source electrode 22 via the metal silicide film 23.

The metal silicide film 23 is provided on the first gate electrode 17, on the second gate electrode 18, and on the second gate insulator film 16 between the first gate electrode 17 and the second gate electrode 18. The metal silicide film 23 contacts the first gate electrode 17 and the second gate electrode 18; and the first gate electrode 17 and the second gate electrode 18 are shorted by the metal silicide film 23.

The first gate electrode 17 and the second gate electrode 18 are electrically connected to a not-shown gate interconnect via the metal silicide film 23.

In the n-channel-type MOSFET, the desired gate voltage is applied to the first gate electrode 17 and the second gate electrode 18 in the state in which a relatively high potential is applied to the drain electrode 21 and a relatively low potential is applied to the source electrode 22; an inversion layer (an n-channel) is formed in the channel region 11; and the state is switched to the on-state.

A multi gate oxide dual work function (DWF)-MOSFET can be considered to be equivalent to a configuration in which two MOSFETs having different current driving capabilities are connected in series in the channel-length direction.

The work function of the first gate electrode 17 formed on the drain side is lower than that of the second gate electrode 18. Accordingly, the threshold voltage is lower and the current driving capability is higher for the drain side MOSFET that includes the first gate electrode 17 than for the source side MOSFET that includes the second gate electrode 18.

The current of the drain side MOSFET having a high current driving capability is limited to match the current driving capability of the source side MOSFET. Accordingly, the second gate electrode 18 functions as the effective gate.

The channel potential (the barrier height for the electrons) directly under the second gate electrode 18 having a high work function is higher than the channel potential of directly under the first gate electrode 17 having a low work function; and a difference in levels of the channel potential can be made.

Accordingly, in the DWF-MOSFET, the electron injection is promoted by the potential drop at the boundary between the first gate electrode 17 and the second gate electrode 18; and high transconductance and low drain conductance can be realized.

On the second gate electrode 18 side that functions as the effective gate, the equivalent oxide thickness of the second gate insulator film 16 is set to be thinner than the equivalent oxide thickness of the first gate insulator film 15 to increase the channel controllability by the second gate electrode 18.

On the other hand, on the first gate electrode 17 side, the gate capacitance is reduced by setting the equivalent oxide thickness of the first gate insulator film 15 to be thicker than the equivalent oxide thickness of the second gate insulator film 16.

To set the work function to be different between the first gate electrode 17 and the second gate electrode 18, according to the embodiment, the first gate electrode 17 includes n-type silicon; and the second gate electrode 18 includes p-type silicon.

Generally, compared to an n-type silicon gate MOSFET, there is a tendency for the threshold to be too high in a p-type silicon gate n-channel-type MOSFET. Therefore, there are cases where the threshold becomes too high in the DWF-MOSFET in which the second gate electrode 18 using p-type silicon functions as the effective gate.

Although it may be considered to use a metal gate including a metal material having a work function that is between those of the n-type silicon and the p-type silicon as the second gate electrode 18, the process is easy and inexpensive when the silicon gate is used.

Figure 2A:
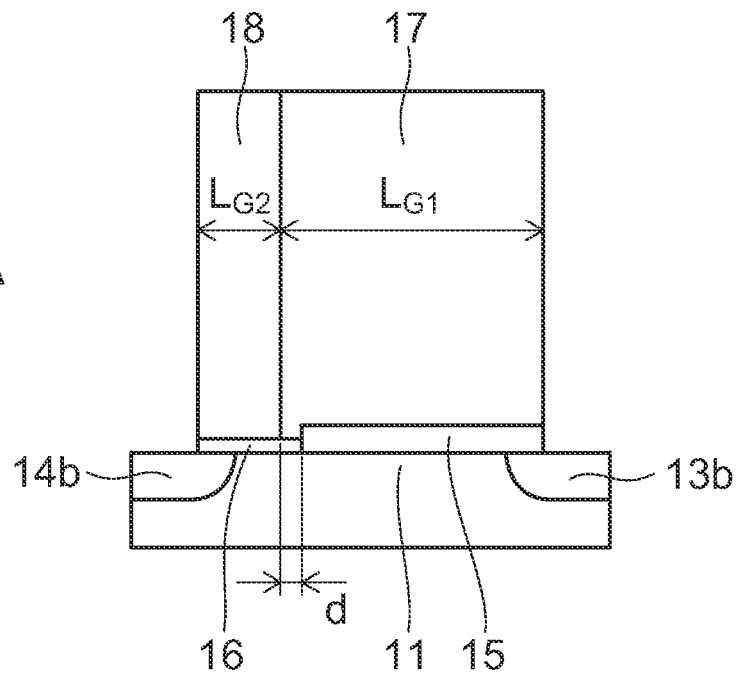
FIG. 2A is a schematic view of the semiconductor device of the embodiment and FIG. 2B is a schematic view of a semiconductor device of a reference example.

FIG. 2A is a schematic view of a model of the gate portion of the semiconductor device of the embodiment for simulating the electrical characteristics.

Although the thicknesses are shown as being different between the first gate insulator film 15 and the second gate insulator film 16 in FIG. 2A, the difference of the thicknesses represents the difference of the equivalent oxide thicknesses.

Figure 2B:
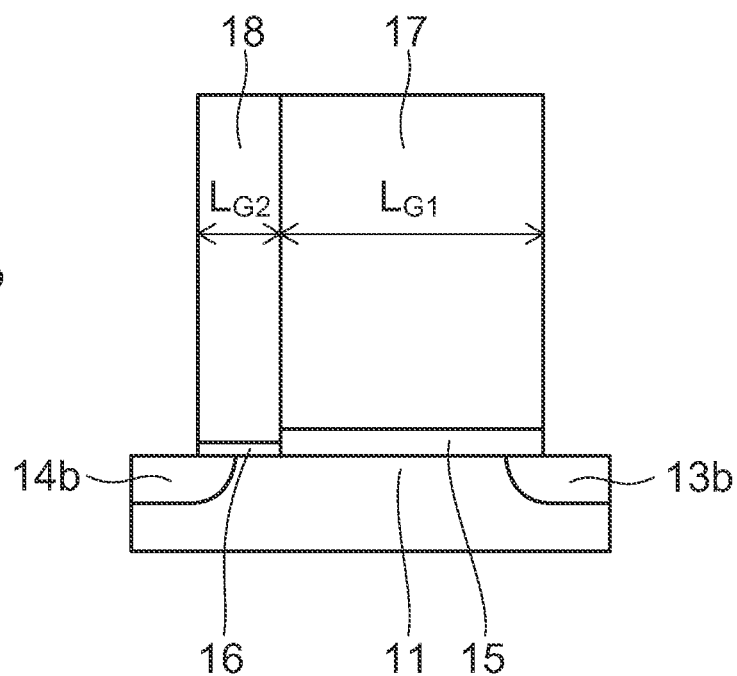

FIG. 2B is a schematic view of a model of the gate portion of a semiconductor device of a reference example for simulating the electrical characteristics.

In the semiconductor device of the reference example, the boundary position between the first gate electrode 17 and the second gate electrode 18 matches the boundary position between the first gate insulator film 15 and the second gate insulator film 16. Otherwise, the configuration is the same as FIG. 2A.

In FIGS. 2A and 2B, a gate length $L_{G1}$ of the first gate electrode 17 is 75 nm; and a gate length $L_{G2}$ of the second gate electrode 18 is 25 nm.

In FIG. 2A, the distance d in the channel-length direction between the boundary between the first gate electrode 17 and the second gate electrode 18 and the boundary between the first gate insulator film 15 and the second gate insulator film 16 is 5 nm. Of the gate length $L_{G1}$ (75 nm) of the first gate electrode 17, the 5 nm on the source side is provided on the second gate insulator film 16. Here, d is the length in the gate-length direction of the portion of the first gate electrode 17 overlapping the second gate insulator film 16.

According to the embodiment, the boundary between the first gate electrode 17 and the second gate electrode 18 is shifted to be on the source side of the boundary between the first gate insulator film 15 and the second gate insulator film 16. In other words, a portion of the first gate electrode 17 on the source side is provided on the second gate insulator film 16.

Figure 3A:
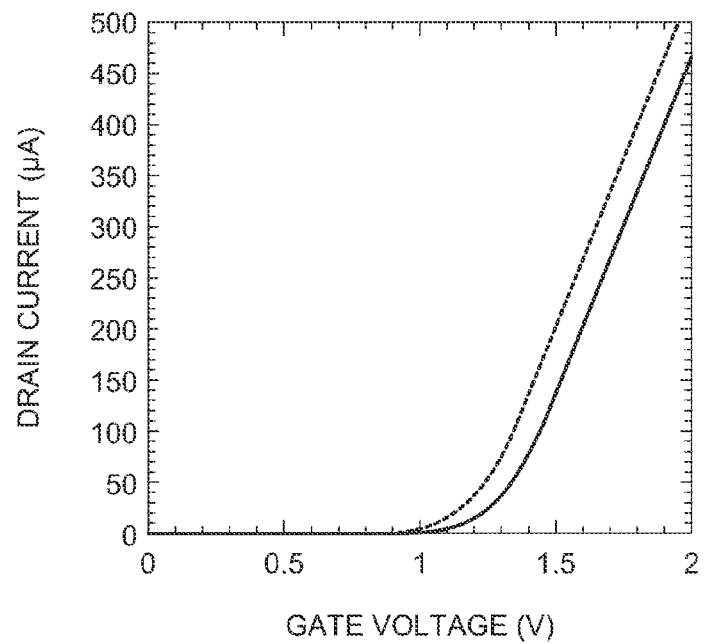
FIG. 3A is a threshold characteristic diagram made by simulation and FIG. 3B is a potential profile of a channel region made by simulation.

FIG. 3A shows the results of a simulation comparing the thresholds (the voltages) of the embodiment of FIG. 2A and the reference example of FIG. 2B. The vertical axis is the drain current (μA); and the horizontal axis is the gate voltage (V). The solid line illustrates the result of the reference example; and the broken line illustrates the result of the embodiment.

It can be seen from FIG. 3A that the threshold of the embodiment is shifted to be about 100 mV lower than that of the reference example.

Figure 3B:
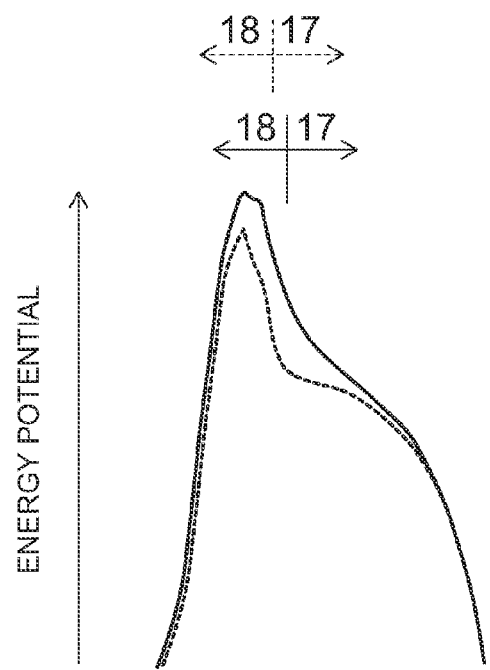

FIG. 3B shows the energy potential profile of the channel region made by simulation. The solid line illustrates the potential profile of the reference example (FIG. 2B); and the broken line illustrates the potential profile of the embodiment (FIG. 2A).

According to the embodiment, because the first gate electrode 17 also affects the second gate insulator film 16 that has a thinner equivalent oxide thickness than the first gate insulator film 15, the channel potential can be modified from the reference example (the solid line) to the broken line of FIG. 3B. In other words, compared to the reference example, the channel potential on the second gate electrode 18 side is lower; and the threshold is lower. Accordingly, the threshold can be suppressed not to become too high by the second gate electrode 18 that is the p-type silicon gate.

Figure 4:
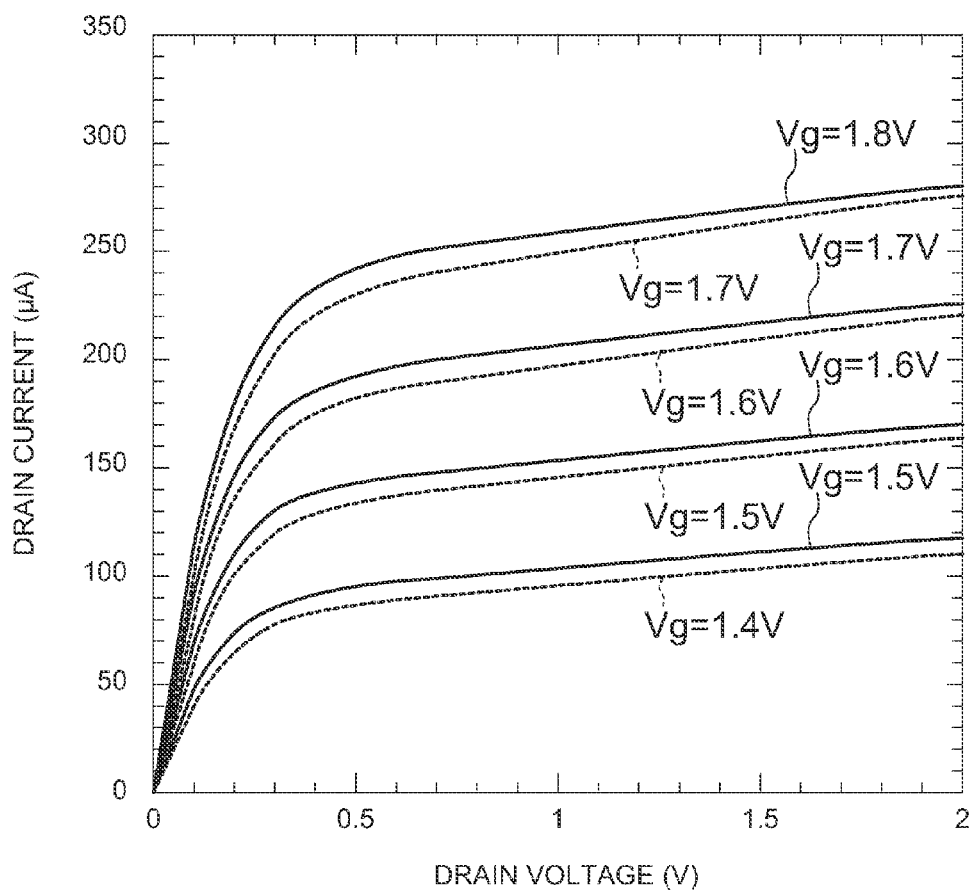
FIG. 4 is a drain current-drain voltage characteristic diagram made by simulation.

FIG. 4 is a drain current-drain voltage characteristic diagram made by simulation. The vertical axis is the drain current (μA); and the horizontal axis is the drain voltage (V). Vg is the gate voltage. The solid lines illustrate the characteristics of the reference example (FIG. 2B); and the broken lines illustrate the characteristics of the embodiment (FIG. 2A).

From FIG. 4, according to the embodiment, a drain current that is about the same as that of the reference example can be obtained at a gate voltage Vg that is lower than that of the reference example.

Figure 5:
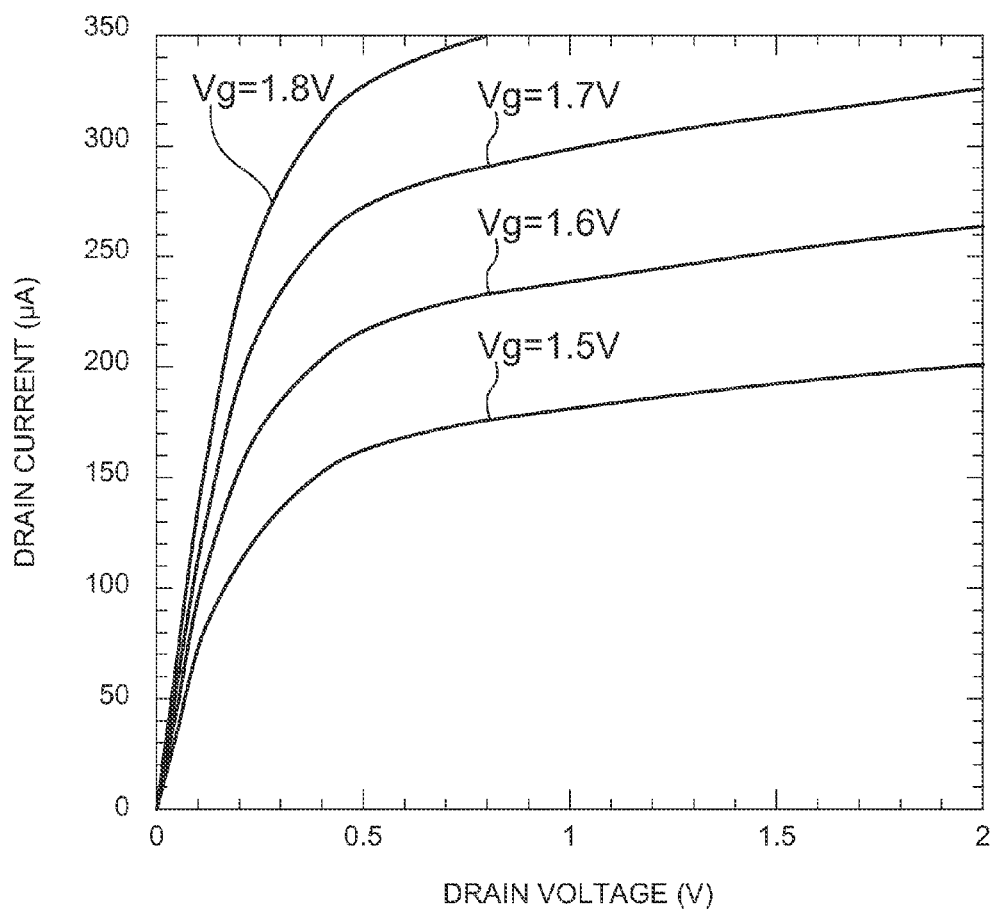
FIG. 5 is a drain current-drain voltage characteristic diagram made by simulation.

The distance d of FIG. 2A is 5 nm for the characteristics of the embodiment (the broken lines) of FIG. 4. Conversely, FIG. 5 shows the current-voltage characteristics similarly to FIG. 4 in the case where the distance d of FIG. 2A is 25 nm.

As the region where the first gate electrode 17 is formed on the second gate insulator film 16 is made longer, the effects of the first gate electrode 17 become stronger; and the static characteristics degrade compared to the characteristics of the broken lines of FIG. 4. Accordingly, to be used as a constant current source that causes a constant current to flow regardless of the voltage change, it is desirable to limit the distance d recited above to be 10 nm or less, e.g., about several nm.

A method for manufacturing the semiconductor device of the embodiment will now be described.

FIG. 6A to FIG. 11B are schematic cross-sectional views showing the method for manufacturing the semiconductor device of the embodiment.

Figure 6A:
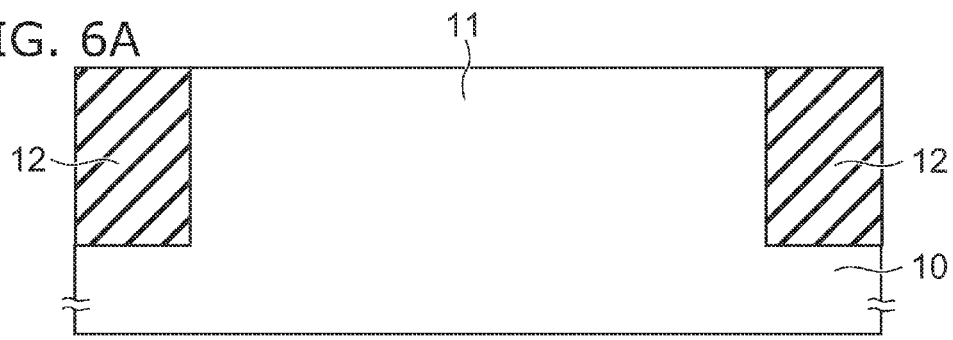
FIG. 6A to FIG. 11B are schematic cross-sectional views showing a method for manufacturing the semiconductor device of the embodiment.

As shown in FIG. 6A, the element separation region 12 of STI (Shallow Trench Isolation) is formed on the surface side of the semiconductor layer (e.g., a silicon substrate) 10.

Then, the p-type channel region 11 is formed by using, for example, ion implantation to introduce an impurity for adjusting the threshold voltage into the element region that is divided by or enclosed with the element separation region 12.

Figure 6B:
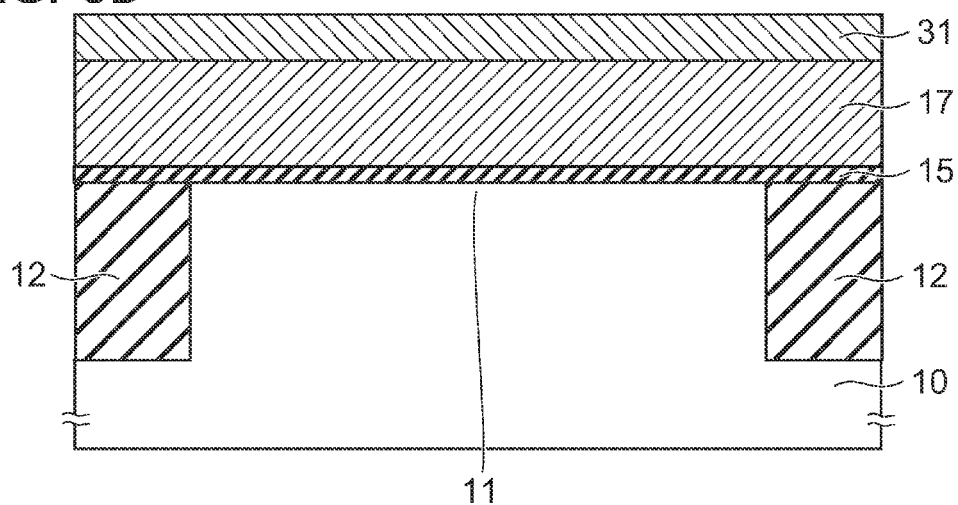

As shown in FIG. 6B, a stacked film that is made of the first gate insulator film 15, the first gate electrode 17, and a hard mask layer 31 is formed on the channel region 11.

For example, a silicon oxide film is formed by thermal oxidation as the first gate insulator film 15. For example, a polycrystalline silicon film is deposited with a thickness of 100 nm by CVD (Chemical Vapor Deposition) as the first gate electrode 17 on the first gate insulator film 15. For example, phosphorus is introduced to the polycrystalline silicon film by ion implantation. Accordingly, the first gate electrode 17 is made of n-type polycrystalline silicon.

For example, a silicon nitride film is deposited with a thickness of 50 nm by CVD as the hard mask layer 31 on the first gate electrode 17 to protect the first gate electrode 17 in the subsequent processes.

Figure 6C:
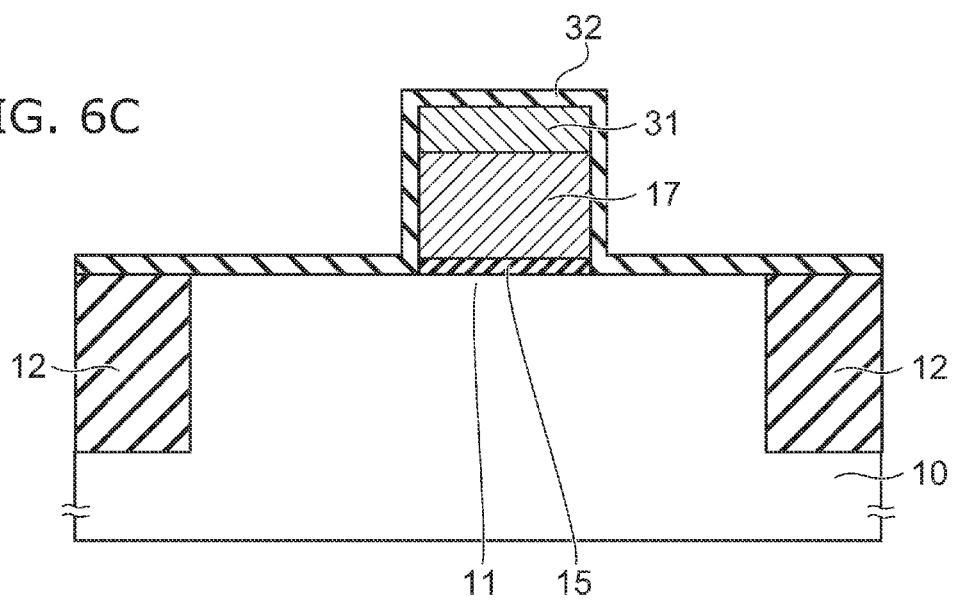

Then, the stacked film that is made of the first gate insulator film 15, the first gate electrode 17, and the hard mask layer 31 is patterned by, for example, RIE (Reactive Ion Etching) using a not-shown resist, etc., as a mask. As shown in FIG. 6C, the stacked film is patterned into a line configuration extending in the direction piercing the page surface.

Continuing, a cover insulating film 32 is formed on the semiconductor layer 10 to cover the stacked film. For example, a silicon oxide film is deposited with a thickness of 20 nm by CVD as the cover insulating film 32.

Figure 7A:
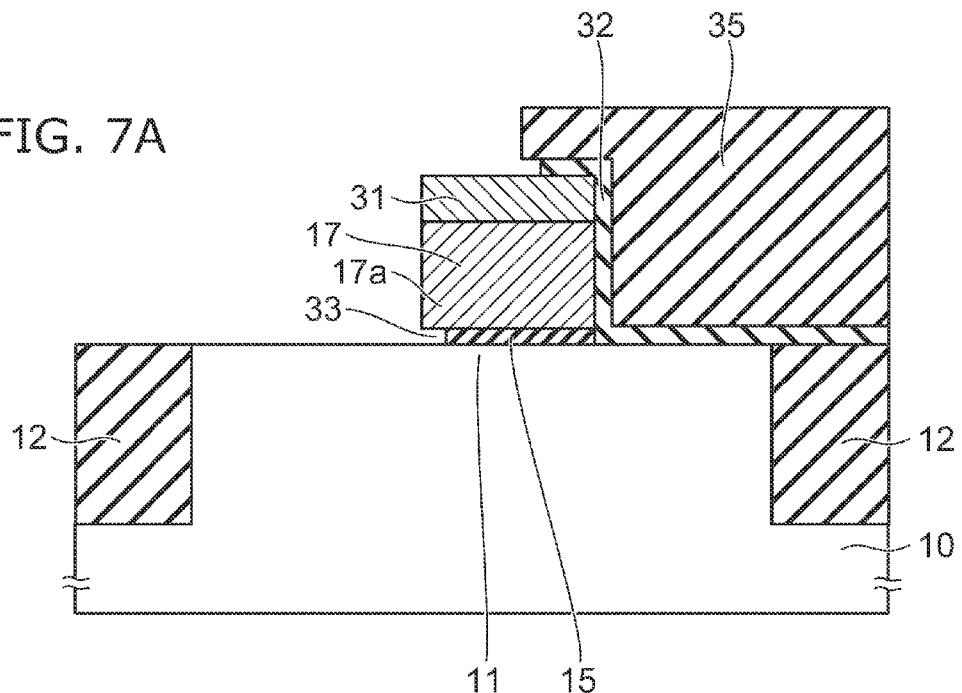
Figure 7B:
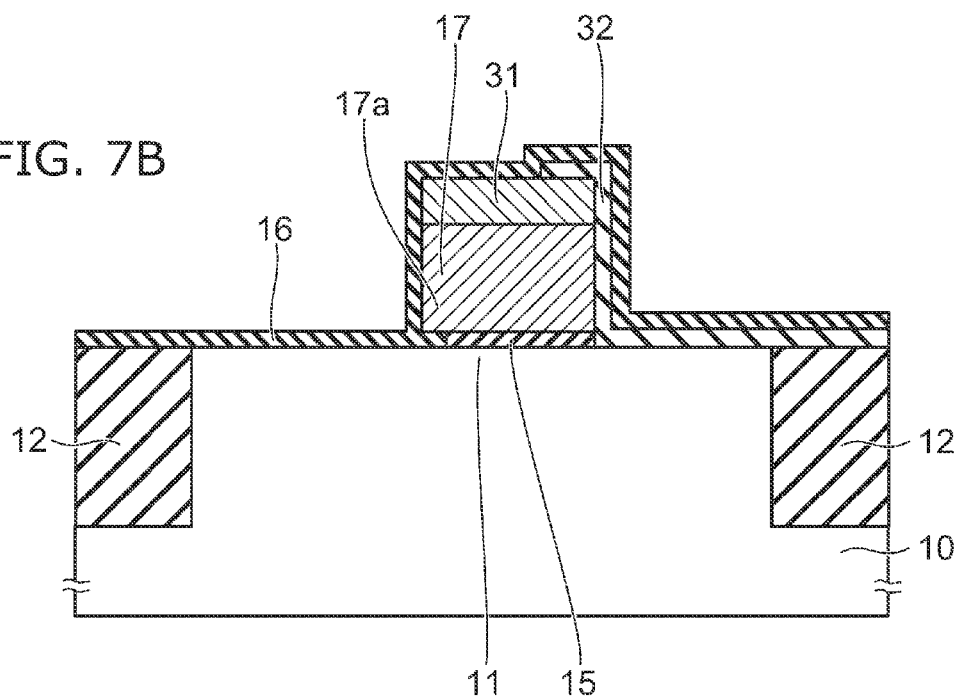

A resist 35 is formed on the cover insulating film 32; and the resist 35 is patterned as shown in FIG. 7A to remain to cover the drain-side region (in the figure, the region on the right side of the first gate electrode 17). Then, the cover insulating film 32 in the source-side region (in the figure, the region on the left side of the first gate electrode 17) is removed by wet etching using the resist 35 as a mask.

At this time, the time of the wet etching is controlled appropriately to make a gap 33 under the end portion 17a of the first gate electrode 17 on the source side by etching the first gate insulator film 15 under the end portion 17a of the first gate electrode 17 on the source side from the exposed edge side of the first gate insulator film 15.

The etching of the first gate insulator film 15 under the first gate electrode 17 is caused to progress so that the etched portion is about the same as the thickness (the physical film thickness) of the first gate insulator film 15. Considering the degradation of the static characteristics described above in regard to FIG. 5 and the process of filling the second gate insulator film 16 into the gap 33, it is desirable to set the ratio (the aspect ratio) of the height and the length of the gap 33 to be 1 or a value that is nearly 1.

The damage layer of the silicon surface occurring due to the RIE recited above can be removed by the wet etching.

Although a portion of the resist 35 is formed also on the hard mask layer 31, a portion of the cover insulating film 32 between the hard mask layer 31 and the resist 35 also is removed by being etched from the exposed edge side of the cover insulating film 32.

Then, after removing the resist 35, the second gate insulator film 16 is formed on the entire exposed surface. The second gate insulator film 16 is, for example, a hafnium oxide film having a dielectric constant that is higher than that of the first gate insulator film 15 which is a silicon oxide film.

The hafnium oxide film is formed conformally along the surface of the semiconductor layer 10, the side surface of the first gate electrode 17 on the source side, the upper surface of the hard mask layer 31, and the surface of the cover insulating film 32 by, for example, ALD (Atomic Layer Deposition).

Also, the second gate insulator film 16 is filled into the gap 33 under the end portion 17a of the first gate electrode 17 on the source side. Because the aspect ratio of the gap 33 is 1 or a value that is nearly 1, the second gate insulator film 16 can be filled to the innermost portion of the gap 33 without causing voids to occur.

The physical film thicknesses of the first gate insulator film 15 and the second gate insulator film 16 are several nm, and more specifically, not less than 2 nm and not more than 5 nm, and are substantially equal. The dielectric constant of the second gate insulator film 16 is higher than that of the first gate insulator film 15. Accordingly, the equivalent oxide thickness of the second gate insulator film 16 is thinner than that of the first gate insulator film 15.

It is sufficient for the equivalent oxide thickness of the second gate insulator film 16 to be thinner than the equivalent oxide thickness of the first gate insulator film 15; and it is unnecessary for the physical film thickness of the second gate insulator film 16 to rigorously match the physical film thickness of the first gate insulator film 15.

Figure 8A:
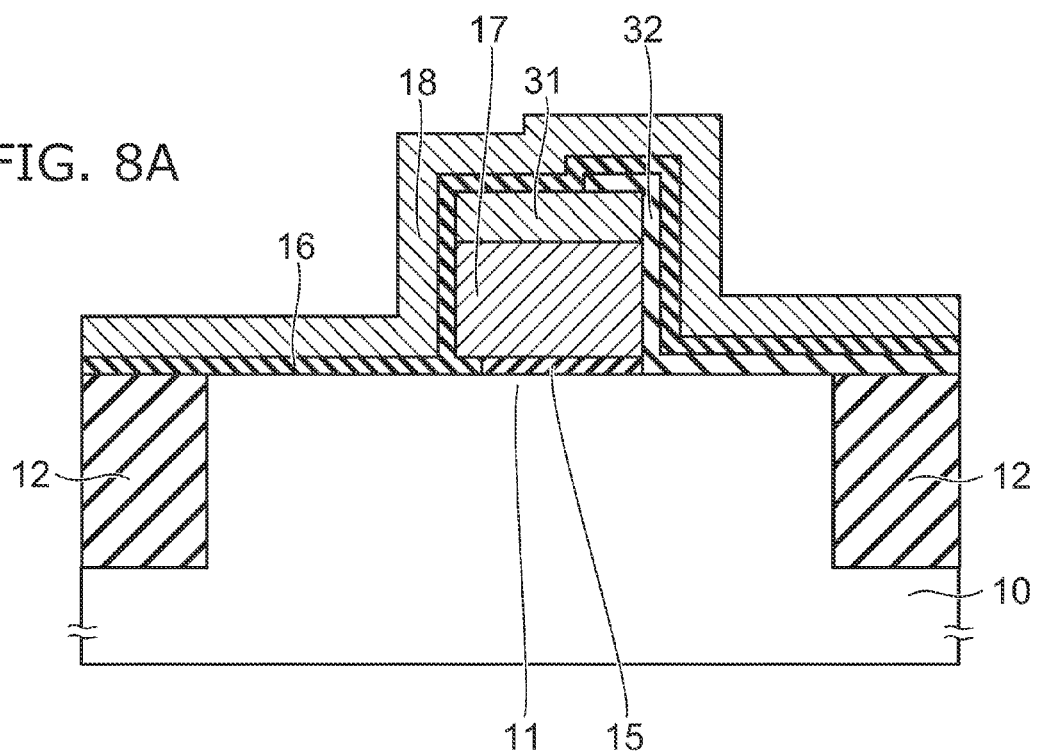

Then, as shown in FIG. 8A, the second gate electrode 18 is formed conformally on the second gate insulator film 16. For example, a polycrystalline silicon film is deposited with a thickness of 30 nm by CVD as the second gate electrode 18; and a p-type impurity is introduced to the polycrystalline silicon film.

Figure 8B:
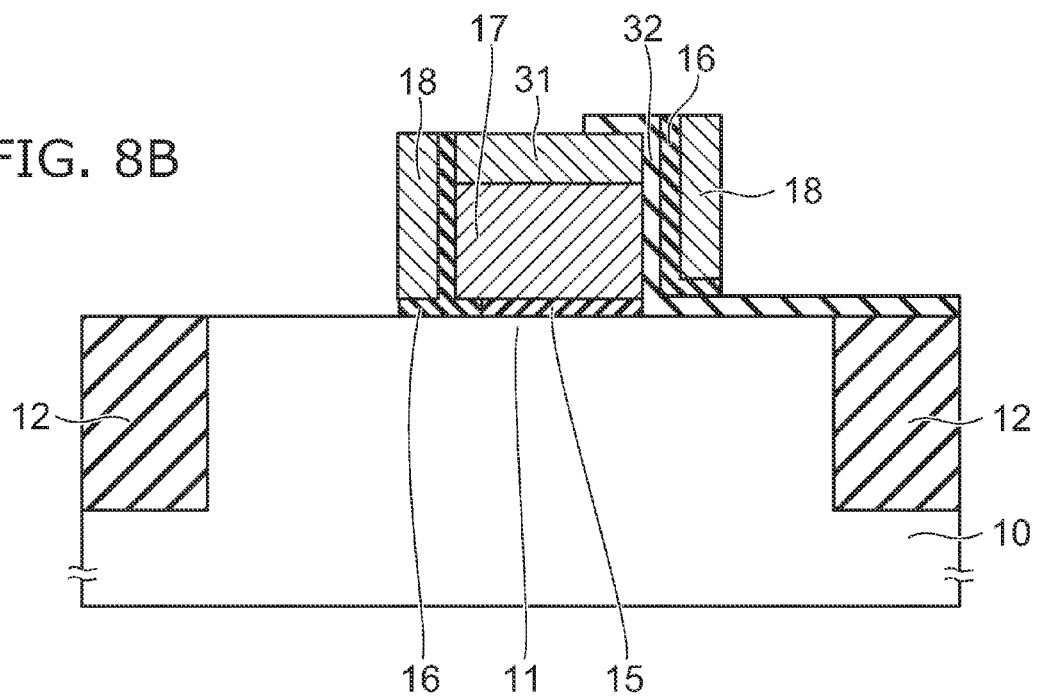

Continuing as shown in FIG. 8B, etch-back of the second gate electrode 18 by RIE is performed; and the second gate electrode 18 that is deposited on the side wall of the second gate insulator film 16 is caused to remain. The second gate electrode 18 is provided on the side wall of the first gate electrode 17 on the source side with the second gate insulator film 16 interposed. Also, the second gate electrode 18 that is on the source side is provided on the channel region 11 with the second gate insulator film 16 interposed.

Then, the cover insulating film 32 is removed by, for example, wet etching. At this time, the second gate insulator film 16 and the second gate electrode 18 that are deposited on the cover insulating film 32 on the drain side are removed as shown in FIG. 9A by lift-off with the cover insulating film 32.

The cover insulating film 32 and the first gate insulator film 15 are, for example, the same silicon oxide film. Accordingly, in the wet etching of the cover insulating film 32, a gap 34 is made under the end portion of the first gate electrode 17 on the drain side by also etching the first gate insulator film 15 that is under the end portion of the first gate electrode 17 on the drain side from the exposed edge side of the first gate insulator film 15.

Figure 9A:
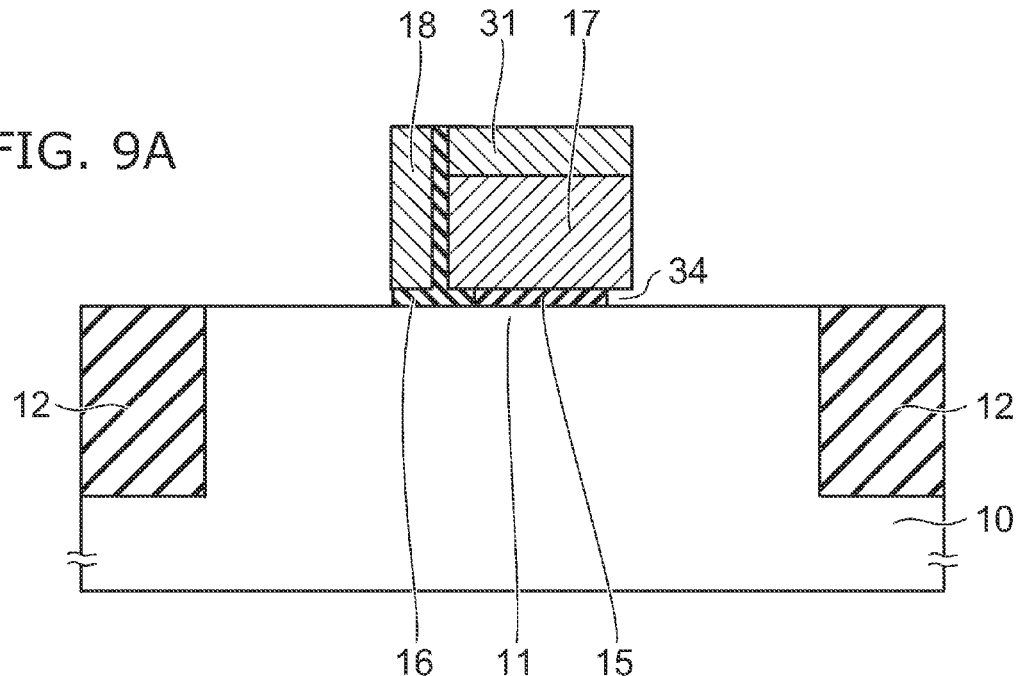
Figure 9B:
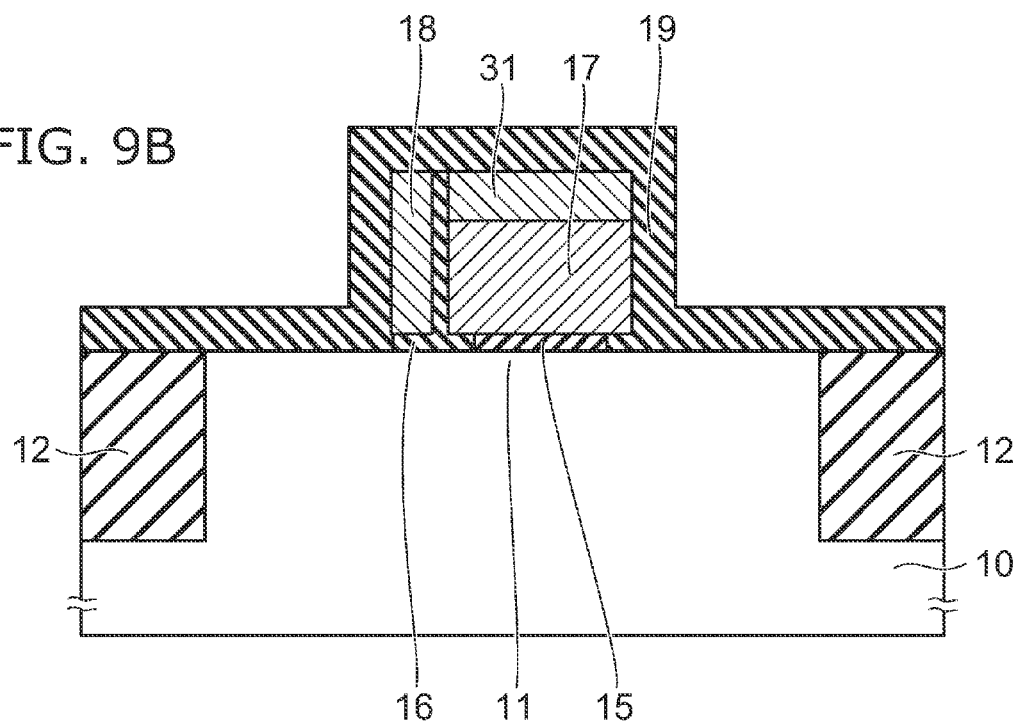

Then, as shown in FIG. 9B, the first sidewall insulating film 19 is formed conformally on the surface of the structural body shown in FIG. 9A. For example, a silicon oxide film is deposited with a thickness of 5 nm by CVD as the first sidewall insulating film 19.

At this time, the first sidewall insulating film 19 also is filled into the gap 34 under the drain-side end portion of the first gate electrode 17. Because both the first sidewall insulating film 19 and the first gate insulator film 15 are the same silicon oxide film, the first sidewall insulating film 19 that is filled into the gap 34 functions as the first gate insulator film 15.

Figure 10A:
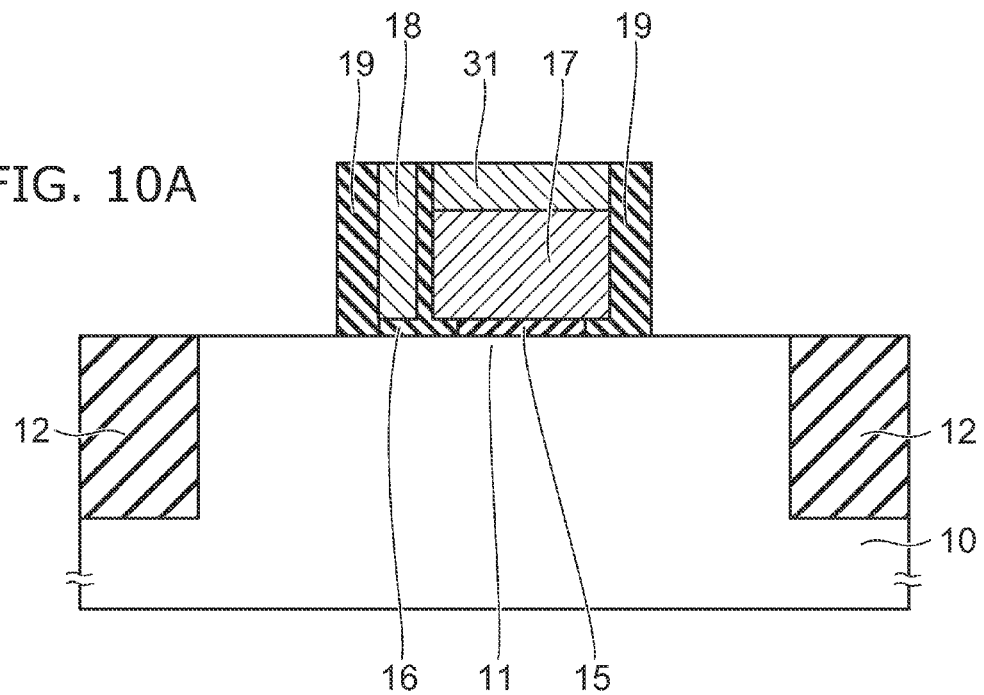

Then, as shown in FIG. 10A, etch-back of the first sidewall insulating film 19 is performed by RIE so that the first sidewall insulating film 19 that is deposited on the side wall of the second gate electrode 18 on the source side and the first sidewall insulating film 19 that is deposited on the side wall of the first gate electrode 17 on the drain side remain.

Continuing, an n-type impurity is introduced to the surface of the semiconductor layer 10 by ion implantation using the structural body on the semiconductor layer 10 shown in FIG. 10A as a mask. For example, arsenic is introduced as the n-type impurity with an acceleration voltage of 1 keV and a dose of $1\times10^{15}$ cm$^{-2}$.

Figure 10B:
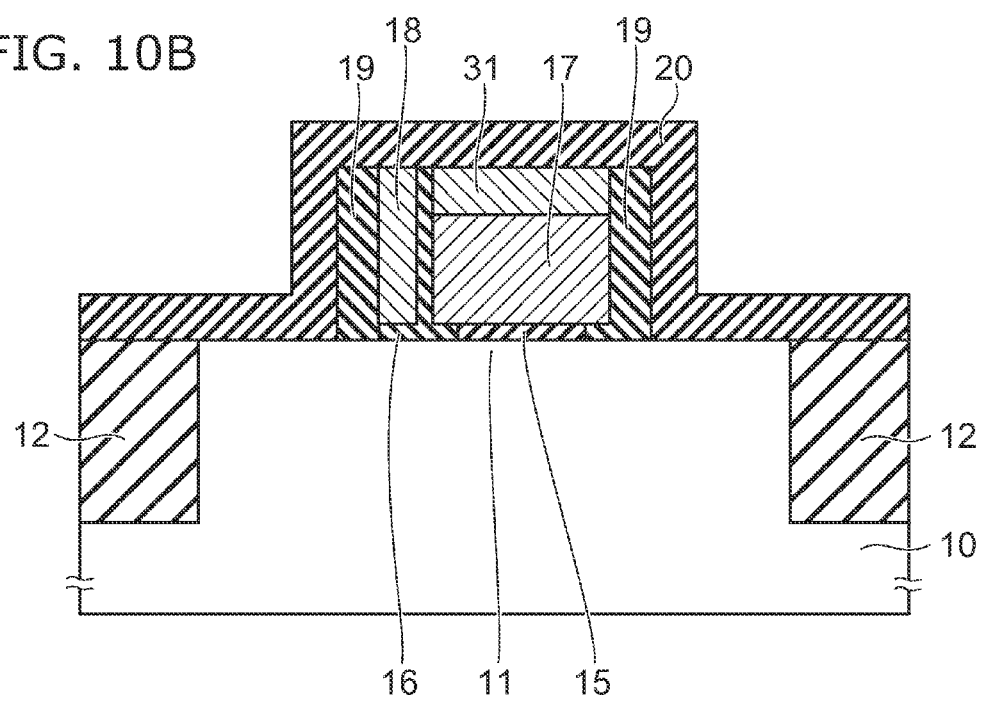

Then, as shown in FIG. 10B, the second sidewall insulating film 20 is formed conformally on the surface of the structural body shown in FIG. 10A. For example, a silicon oxide film is deposited with a thickness of 30 nm by CVD as the second sidewall insulating film 20.

Figure 11A:
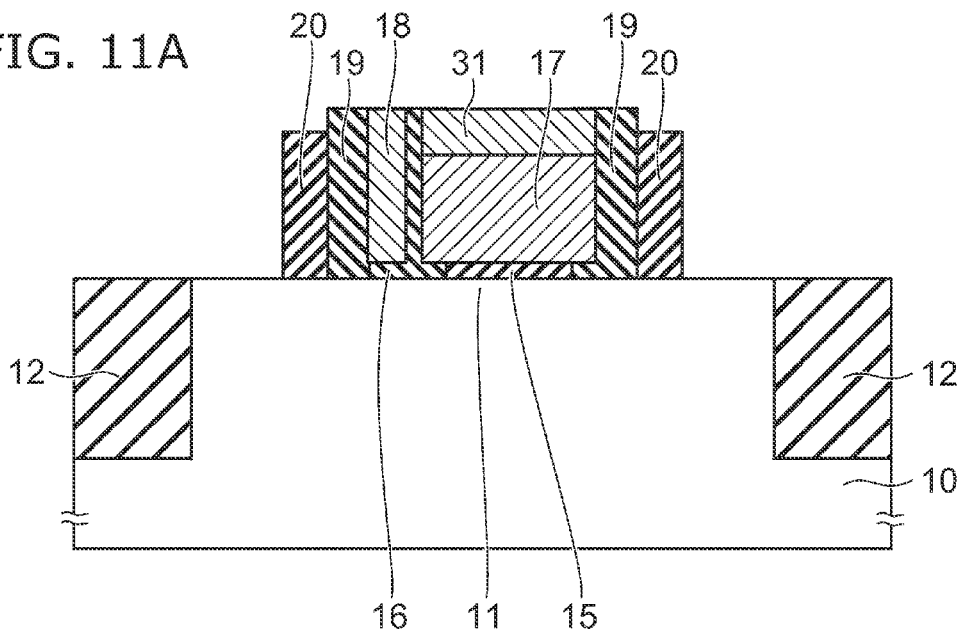

Continuing as shown in FIG. 11A, etch-back of the second sidewall insulating film 20 is performed by RIE so that the second sidewall insulating film 20 that is deposited on the side wall of the first sidewall insulating film 19 on the source side and the second sidewall insulating film 20 that is deposited on the side wall of the first sidewall insulating film 19 on the drain side remain.

Then, an n-type impurity is introduced to the surface of the semiconductor layer 10 by ion implantation using the structural body on the semiconductor layer 10 shown in FIG. 11A as a mask. For example, arsenic is introduced as the n-type impurity with an acceleration voltage of 20 keV and a dose of $3\times10^{15}$ cm$^{-2}$.

Subsequently, an annealing process is performed at, for example, 1050° C. to activate the impurity introduced by the ion implantation. Thereby, as shown in FIG. 11B, the drain region 13a, the drain extension region 13b, the source region 14a, and the source extension region 14b are formed in the surface of the semiconductor layer 10.

Figure 11B:
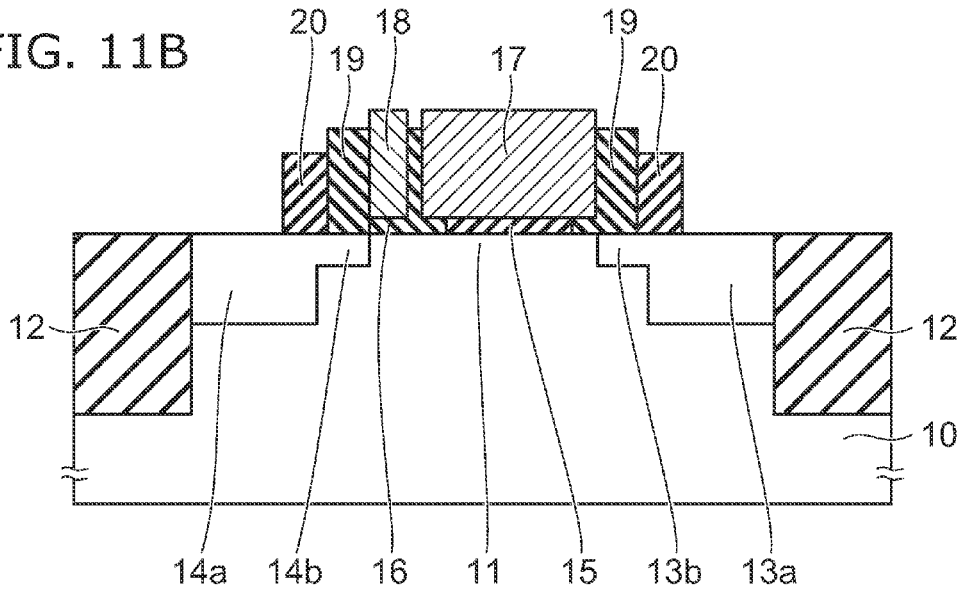

Subsequently, as shown in FIG. 11B, the upper surface of the first gate electrode 17 is exposed by, for example, using hot phosphoric acid to remove the hard mask layer 31 which is a silicon nitride film.

At this time, although having etching rates that are lower than that of the silicon nitride film, the upper portions of the second gate insulator film 16, the first sidewall insulating film 19, and the second sidewall insulating film 20 which are silicon oxide films and the upper portion of the second gate electrode 18 which is a polycrystalline silicon layer are etched.

Although the second gate electrode 18 is the p-type, the n-type impurity is implanted into the upper portion of the second gate electrode 18 in the ion implantation described above that forms the drain region 13a, the drain extension region 13b, the source region 14a, and the source extension region 14b. Accordingly, although the p-type impurity concentration of the upper portion of the second gate electrode 18 decreases, the upper portion of the second gate electrode 18 also is removed in the etching using hot phosphoric acid to remove the hard mask layer 31; and therefore, only the portion having the appropriate p-type impurity concentration remains as the second gate electrode 18.

After removing the hard mask layer 31, the metal silicide film 23 is formed on the drain region 13a, the source region 14a, the first gate electrode 17, and the second gate electrode 18 as shown in FIG. 1. The first gate electrode 17 and the second gate electrode 18 are shorted by the metal silicide film 23.

According to the manufacturing method of the embodiment described above, a portion of the first gate electrode 17 can be controlled with high precision to have a length (d of FIG. 2A) extending onto the second gate insulator film 16 by controlling the time of the wet etching that removes the portion of the first gate insulator film 15 on the source side under the first gate electrode 17.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a drain region of a first conductivity type;
   a source region of the first conductivity type;
   a channel region of a second conductivity type provided between the drain region and the source region;
   a first gate insulator film provided on the channel region;
   a second gate insulator film provided on the channel region to be adjacent to the first gate insulator film on a source region side of the first gate insulator film, an electrical thickness of the second gate insulator film being less than an electrical thickness of the first gate insulator film;
   a first gate electrode provided on the first gate insulator film, a portion of the first gate electrode being provided on the second gate insulator film; and
   a second gate electrode provided on the second gate insulator film, a work function of the second gate electrode being higher than a work function of the first gate electrode.

2. The device according to claim 1, wherein a dielectric constant of the second gate insulator film is higher than a dielectric constant of the first gate insulator film.

3. The device according to claim 2, wherein the first gate insulator film is a silicon oxide film, and the second gate insulator film is an oxide film containing hafnium.

4. The device according to claim 3, wherein the oxide film containing hafnium includes one selected from HfO, HfSiO, and HfSiON.

5. The device according to claim 2, wherein a physical film thickness of the first gate insulator film and a physical film thickness of the second gate insulator film are substantially equal.

6. The device according to claim 5, wherein the physical film thicknesses of the first gate insulator film and the second gate insulator film are not less than 2 nm and not more than 5 nm.

7. The device according to claim 1, wherein the first gate electrode and the second gate electrode are silicon layers.

8. The device according to claim 1, wherein the first gate electrode is an n-type silicon layer, and the second gate electrode is a p-type silicon layer.

9. The device according to claim 8, wherein:
   a metal silicide film is provided on the first gate electrode and on the second gate electrode, and
   the first gate electrode and the second gate electrode are shorted via the metal silicide film.

10. The device according to claim 1, wherein a gate length of the first gate electrode is longer than a gate length of the second gate electrode.

11. The device according to claim 1, wherein a length in a gate-length direction of the portion of the first gate electrode overlapping the second gate insulator film is 10 nm or less.

12. The device according to claim 1, wherein an insulating film is provided between a side wall of the first gate electrode on a second gate electrode side and a side wall of the second gate electrode on a first gate electrode side.

13. The device according to claim 1, wherein the second gate insulator film is provided also between a side wall of the first gate electrode on a second gate electrode side and a side wall of the second gate electrode on a first gate electrode side.

14. The device according to claim 13, wherein the second gate insulator film is provided in an inverted T-shaped cross-sectional configuration under the first gate electrode, under the second gate electrode, and between the side wall of the first gate electrode and the side wall of the second gate electrode.

15. A semiconductor device, comprising:
   a drain region of a first conductivity type;
   a source region of the first conductivity type;
   a channel region of a second conductivity type provided between the drain region and the source region;
   a first gate insulator film provided on the channel region;
   a second gate insulator film provided on the channel region to be adjacent to the first gate insulator film on a source region side of the first gate insulator film, an electrical thickness of the second gate insulator film being less than an electrical thickness of the first gate insulator film;
   a first gate electrode provided on the first gate insulator film; and
   a second gate electrode provided on the second gate insulator film, a work function of the second gate electrode being higher than a work function of the first gate electrode,
   wherein an end of the first gate electrode on a second gate electrode side is shifted to be on a source region side of a boundary between the first gate insulator film and the second gate insulator film.

16. The device according to claim 15, wherein a dielectric constant of the second gate insulator film is higher than a dielectric constant of the first gate insulator film.

17. The device according to claim 15, wherein the first gate electrode is an n-type silicon layer, and the second gate electrode is a p-type silicon layer.

18. A method for manufacturing a semiconductor device, comprising:
  forming a stacked film on a semiconductor layer, the stacked film including a first gate insulator film and a first gate electrode being provided on the first gate insulator film;
  making a gap between the semiconductor layer and one end portion in a channel-length direction of the first gate electrode by removing the first gate insulator film under the one end portion of the first gate electrode;
  forming a second gate insulator film in the gap and on the semiconductor layer in a region on a side of the gap opposite to the first gate insulator film, a dielectric constant of the second gate insulator film being higher than a dielectric constant of the first gate insulator film; and
  forming a second gate electrode on the second gate insulator film, a work function of the second gate electrode being higher than a work function of the first gate electrode.

19. The method according to claim 18, wherein:
  the second gate insulator film is formed also on a side surface of the first gate electrode on a side of the one end portion, and
  the second gate insulator film is interposed between the second gate electrode and the side surface of the first gate electrode.

20. The method according to claim 18, wherein the gap is made by removing the first gate insulator film by wet etching.

\* \* \* \* \*